США009007241B2

(12) United States Patent
Alhussien et al.

(10) Patent No.: US 9,007,241 B2
(45) Date of Patent: Apr. 14, 2015

(54) REDUCED POLAR CODES

(71) Applicant: Seagate Technology LLC, Cupertino, CA (US)

(72) Inventors: AbdelHakim S. Alhussien, San Jose, CA (US); Erich F. Haratsch, Bethlehem, PA (US); Yue Li, College Station, TX (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/033,854

(22) Filed: Sep. 23, 2013

(65) Prior Publication Data

US 2015/0077277 A1 Mar. 19, 2015

Related U.S. Application Data

(60) Provisional application No. 61/878,163, filed on Sep. 16, 2013.

(51) Int. Cl.
*H03M 7/40* (2006.01)
*H03M 13/29* (2006.01)
*H04Q 11/04* (2006.01)
*H04L 1/00* (2006.01)
*H03M 7/30* (2006.01)

(52) U.S. Cl.
CPC ...... *H03M 13/2906* (2013.01); *H03M 13/2957* (2013.01); *H03M 7/40* (2013.01); *H04Q 11/0478* (2013.01); *H04L 1/0057* (2013.01); *H03M 7/30* (2013.01)

(58) Field of Classification Search
CPC ...... H03M 7/40; H03M 7/30; H03M 13/2957
USPC ............... 341/67, 50; 714/755, 752; 370/474; 707/693
See application file for complete search history.

(56) References Cited

U.S. PATENT DOCUMENTS

| 8,347,186 | B1 | 1/2013 | Arikan | 714/774 |
| 2014/0040214 | A1* | 2/2014 | Ma | 707/693 |

OTHER PUBLICATIONS

Arikan, Erdal, "Systematic Polar Coding", IEEE Communication Letters, vol. 15, No. 8, Aug. 2011, pp. 860-862.
Arikan, Erdal, "Channel Polarization: A Method for Constructing Capacity-Achieving Codes for Symmetric Binary-Input Memoryless Channels", IEEE Trans. Inf. Theory, vol. 55, Jun. 2009, pp. 1488-1492.
Leroux, Camille, et al., "Hardware Architectures for Successive Cancellation Decoding of Polar Codes", ICASSP 2011, May 2011, 4 pages.
Tal, Ido, et al., "How to Construct Polar Codes", online: arXiv:1105.6164v2[cs.IT], Oct. 5, 2011, pp. 1-21.

* cited by examiner

*Primary Examiner* — Joseph Lauture
(74) *Attorney, Agent, or Firm* — Christopher P. Maiorana, PC

(57) ABSTRACT

A method for encoding a reduced polar code is disclosed. The method generally includes steps (A) to (C). Step (A) may generate the intermediate codeword by polar code encoding input data. Step (B) may remove one or more bits from one of (i) a first part of the intermediate codeword and (ii) a second part of the intermediate codeword. Step (C) may generate an output codeword by concatenating the first part of the intermediate codeword with the second part of the intermediate codeword after the bits are removed.

18 Claims, 11 Drawing Sheets

REDUCED POLAR CODES

This application relates to U.S. Provisional Application No. 61/878,163, filed Sep. 16, 2013, which is hereby incorporated by reference in its entirety.

FIELD OF THE INVENTION

The invention relates to block coding generally and, more particularly, to a method and/or apparatus for implementing reduced polar codes.

BACKGROUND

Channel architectures of conventional solid-state drives have adaptable codeword lengths for error correcting codes. The adaptation allows the codewords to fit in a length of a page more easily. For example, a widely used page length for a solid-state drive is 71,487 bits. A commonly used commercial error correction code is a Bose Chaudhuri Hocquenghem (i.e., BCH) code with a codeword length of 8,936 bits. To fit in the page length, 8 BCH codewords are used, where the first 7 codewords have lengths of 8,936 bit, and the last codeword is adjusted to have a length of 8,935 bits.

Polar codes are a family of error correction codes which has been theoretically proved to be capacity-achieving. However, the codewords of polar codes are problematic to adapted to the common page lengths for flash channels. The current polar codes specify a length of each codeword be an integer power of two. Thus, for example, conventional polar codewords of the same length do not efficiently fill a 71,487-bit flash page. Furthermore, methods for converting a random bit sequence to a codeword for polar codes is unknown, making performance analysis of the polar codes using simulation challenging with real flash data collected from characterization platforms.

SUMMARY

The invention concerns a method for encoding a reduced polar code. The method generally includes steps (A) to (C). Step (A) may generate the intermediate codeword by polar code encoding input data. Step (B) may remove one or more bits from one of (i) a first part of the intermediate codeword and (ii) a second part of the intermediate codeword. Step (C) may generate an output codeword by concatenating the first part of the intermediate codeword with the second part of the intermediate codeword after the bits are removed.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing reduced polar codes that may (i) produce codewords of many different lengths, (ii) be easily adapted to common page lengths in flash memories, (iii) reduce the length of codewords by shortening, (iv) reduce the length of codewords by puncturing, (v) simulate an experimental performance of polar codes, (vi) simulate using random input/output data traces from flash characterization platforms and/or (vii) be integrated as one or more integrated circuits.

Reduced polar codes refer to polar codes of reduced lengths. The reduced length of a codeword may be other than the normal integer power of two. Reduced polar codes are generally created by shortening and/or puncturing. Shortening is a process for obtaining codewords with shorter lengths and lower rates from a given error correction code codeword by assigning some symbols in the given codeword to fixed values which are known both to an encoder and a decoder. Puncturing is a process for obtaining codewords with shorter lengths and lower rates from a given error correction code codeword by discarding some parity check symbols, or symbols that are not part of user message symbols. The reduced polar codes are applicable in at least data storage systems and digital communication systems where the reduced polar codes are uses as error correction codes. To simulate a performance of the error correcting codes for flash memories, a decoder implementing an error correction code is tested using random input/output bit sequences collected from flash memory characterization platforms. The collected bit sequences can be generated randomly and are not assumed to be the codewords of any error correction code.

Figure 1:
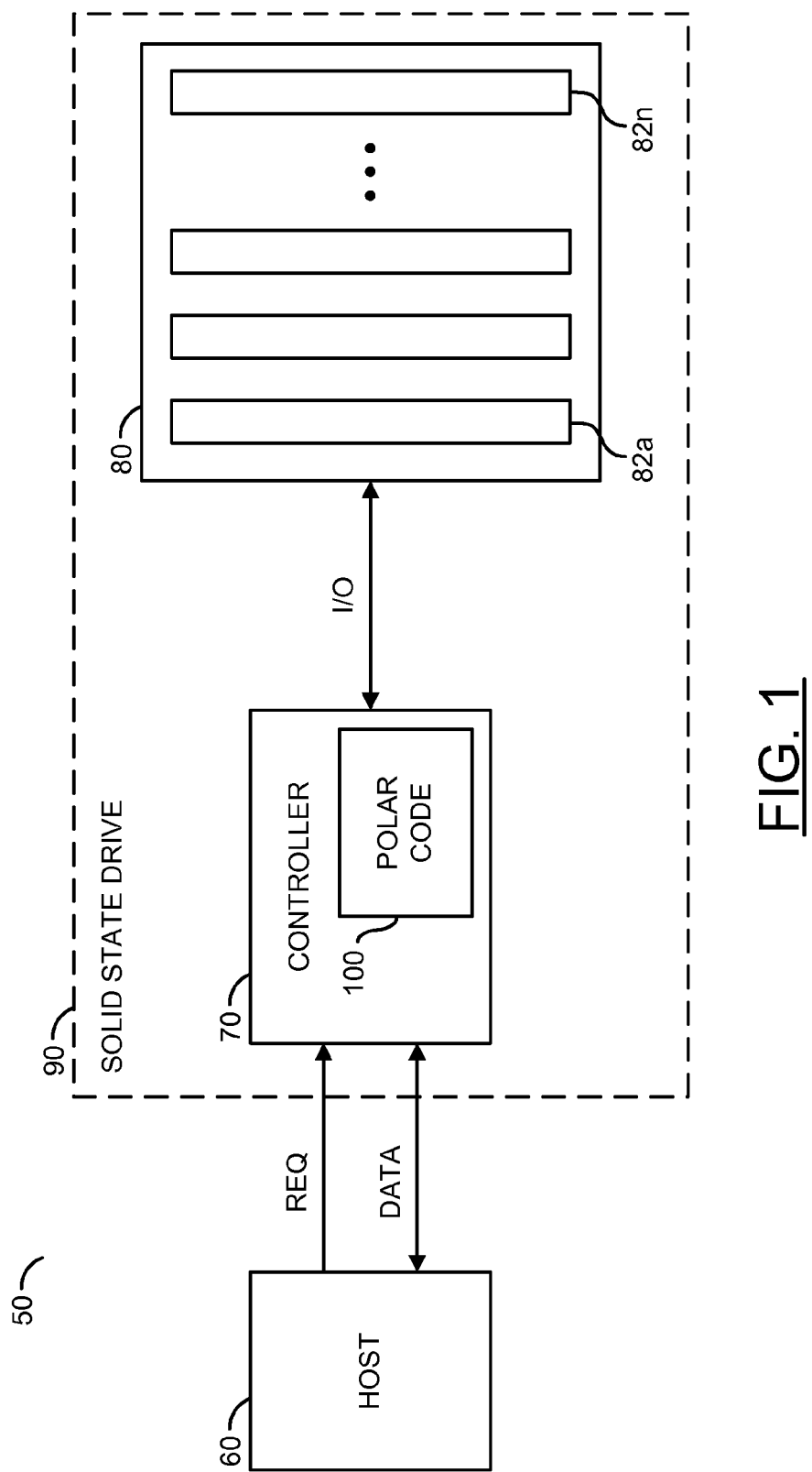
FIG. 1 is a block diagram of an example apparatus.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The logic or instructions, when executed, may perform a number of steps used to perform polar code encoding and/or polar code decoding. The circuits 60 to 100 may represent modules and/or blocks that may be implemented as hardware, software, a combination of hardware and software, or other implementations.

A signal (e.g., REQ) is shown generated by the circuit 60 and received by the circuit 70. The signal REQ is a request signal used to access data from the circuit 80. A signal (e.g., I/O) is shown exchanged between the circuit 70 and the circuit 80. The signal I/O may include one or more address bits and codewords. A signal (e.g., DATA) is shown exchanged between the circuit 60 and the circuit 70. The signal DATA conveys data portions (e.g., read data and/or write data) moved between the circuits 60 and 70.

The circuit 60 is shown implemented as a host circuit. The circuit 60 is generally operational to read and write data to and from the circuit 80 via the circuit 70. When reading or writing data, the circuit 60 may place an address value in the signal REQ to identify which set of data is to be written or to be read from the circuit 80. The write data may be presented in the signal DATA. The read data requested by the circuit 60 may be received via the signal DATA. Addresses in the signal REQ generally spans a logical address range of the circuit 90. The signal REQ can address individual data units, such as SATA (e.g., serial-ATA) sectors.

The circuit 70 is shown implementing a controller circuit. The circuit 70 is generally operational to control reading to and writing from the circuit 80. The circuit 70 comprises one or more integrated circuits (or chips or die) implementing the controller of one or more solid-state drives (e.g., SSD), embedded storage, or other suitable control applications.

The circuit 80 is shown implementing a nonvolatile memory circuit. According to various embodiments, the circuit 80 comprises one or more nonvolatile semiconductor devices 82a-82n. The circuit 80 is generally operational to store data in a nonvolatile condition. When data is read from the circuit 80, the circuit 80 accesses a set of data (e.g., multiple bits) identified by the address (e.g., physical address) in the signal I/O. The signal I/O generally spans a physical address range of the circuit 80.

The circuits 82a-82n may be implemented as NAND flash memory, NOR flash memory, flash memory using polysilicon or silicon nitride technology-based charge storage cells, two-dimensional or three-dimensional technology-based nonvolatile memory, ferromagnetic memory, phase-change memory, racetrack memory, resistive random access memory, magnetic random access memory and similar types of memory devices and/or storage media. In other embodiments, the circuit 70 and/or the circuit 80 may be implemented as all or a portion of a solid-state drive 90 having one or more nonvolatile devices.

Data within the circuit 80 is generally organized in a hierarchy of units. A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integral number of read units.

The circuit 100 is shown implementing a polar code encoding/decoding circuit. In some embodiments, the circuit 100 may be split into an encoding circuit and a separate decoding circuit. The circuit 100 is generally operational to encode data received from the circuit 60 using a shortened polar encoding technique. The shortened codewords are subsequently written in to the circuit 80 via the signal I/O. For read operations, the circuit 100 is operational to decode codewords received from the circuit 80 using a shortened polar decoding technique. Additional details regarding polar codes can be found in "Channel Polarization: A Method for Constructing Capacity-Achieving Codes for Symmetric Binary-Input Memoryless Channels", by Erdal Arikan, IEEE Transactions on Information Theory vol. 55, no. 7, pages 3051-3073, July 2009, which is hereby incorporated by reference in its entirety.

The reduced polar code encoding generally involves concatenating predetermined data to input data (or user data) received in the signal DATA. An intermediate codeword is generated by polar code encoding the now-longer input data. One or more bits are subsequently removed from one of (i) a first part of the intermediate codeword and (ii) a second part of the intermediate codeword. A reduced output codeword is generated by concatenating the first part of the intermediate codeword with the second part of the intermediate codeword after the bits are removed. The output codeword is subsequently written into the circuit 80 via the signal I/O.

The reduced polar code decoding generally involves reading the reduced output codeword from the circuit 80 via the signal I/O. One or more bits are added to one of (i) the first part of the output codeword and (ii) the second part of the output codeword. An internal codeword is generated by concatenating the first part of the output codeword and the second part of the output codeword after the bits are added. Output data is generated by polar code decoding the internal codeword. The predetermined data is subsequently removed from the output data to isolate the original input data.

Figure 2:
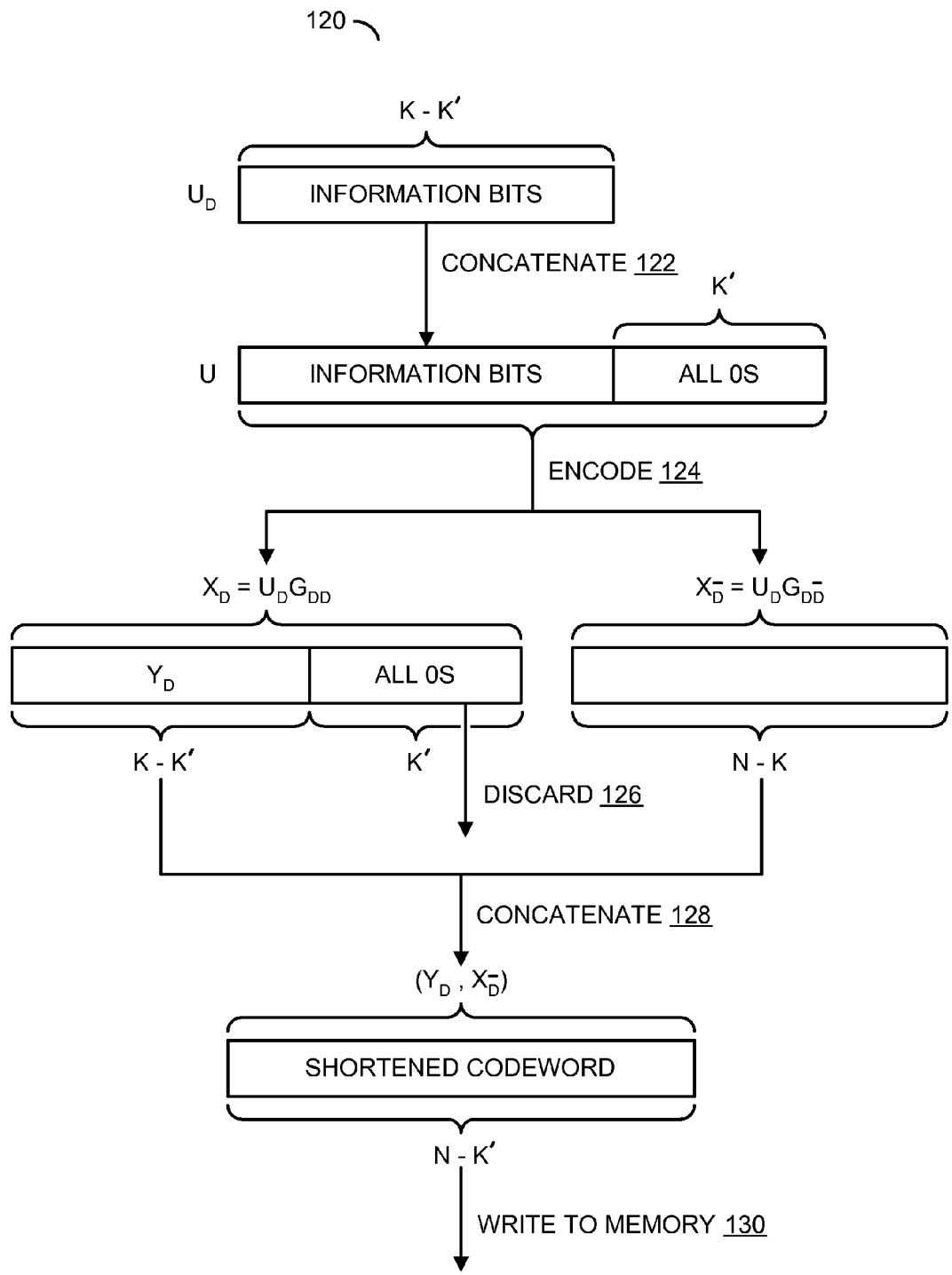
FIG. 2 is a flow diagram of a method for shortened polar code encoding in accordance with an embodiment of the invention.

Referring to FIG. 2, a flow diagram of an example method 120 for shortened polar code encoding is shown in accordance with an embodiment of the invention. The method (or process) 120 is implemented by the circuit 90. The method 120 generally comprises a step (or state) 122, a step (or state) 124, a step (or state) 126, a step (or state) 128 and a step (or state) 130. The steps 122 to 130 may represent modules and/or blocks that may be implemented as hardware, software, a combination of hardware and software, or other implementations.

Consider an (N, K)-binary polar code. A code block length N is defined as $N=2^n$, where K is a dimensionality of the input bits (or code) and n is an integer of one or greater. A non-frozen set of indices D is a subset of all N indices, $D \subseteq \{1, 2, \ldots, N\}$. A frozen set of indices $\overline{D}$ is a subset of all remaining indices $\overline{D} \subseteq \{1, 2, \ldots, N\} - D$. A vector U contains the input bits per $U \triangleq (U_1, U_2, \ldots, U_N)$, and is written as $U=(U_D, U_{\overline{D}})$. The input bits U generally include message (or user) bits $U_D \triangleq (Ui: i \in D) \in \{0,1\}^K$ and frozen bits $U_{\overline{D}} \triangleq (Ui: i \in M\overline{D}) \in \{0,1\}^{N-K}$. A resulting codeword is $X \triangleq (X_1, X_2, \ldots, X_N) \in \{0,1\}^N$.

A non-systematic polar code encoding of the input bits U is generally $X=UG=U_D G_D + U_{\overline{D}} G_{\overline{D}}$, where G is a generator matrix. The matrix G is defined as $G = F \otimes m \in \{0,1\}^{N \times N}$, where the operator $\otimes$ denotes the Kronecker product and the matrix $$F = \begin{pmatrix} 1 & 0 \\ 1 & 1 \end{pmatrix}.$$

The rows of the submatrices $G_D$ and $G_{\overline{D}}$ are from the matrix G with indices in D and $\overline{D}$, respectively.

In a systematic polar code encoding, let the sets $E \subseteq \{1, 2, \ldots, N\}$ and let $\overline{E} \subseteq \{1, 2, \ldots, N\} - E$. Therefore, the codeword X is given by $X=(E, \overline{E})$. Let $G_{DE}$ be a submatrix of G such that for each element $G_{ij}$ of $G_{DE}$, the indices $i \in D$ and $j \in E$. For any given non-systematic encoder with parameter $(D, U_{\overline{D}})$, a systematic encoder $(E, U_{\overline{D}})$ exists if there is a one-to-one mapping from $U_D$ to $X_E$ following equation 1 as follows:

$$X_E = U_E G_{DE} + U_{\overline{D}} G_{DE}, X_{\overline{E}} = U_D G_{D\overline{E}} + U_{\overline{D}} G_{\overline{DE}} \quad (1)$$

Additional details of the mapping may be found in "Systematic Polar Coding", by Erdal Arikan, IEEE Communication Letters, vol. 15, no. 8, pages 860-862, August 2011, which is hereby incorporated by reference in its entirety.

A systematic encoder always exists if and only if $G_{DE}$ is invertible so that $U_D=(X_E+U_{\overline{D}}G_{\overline{D}E})G_{DE}^{-1}$. For example let E=D, a systematic encoder always exists for polar codes since $G_{DD}$ is a lower-triangular matrix which has ones on the diagonal, which is invertible.

Theorem: Let E=D, and let $U_D$ be all zeros (0s). If the last K' bits of $U_D$ are all zeros, then the last K' bits of $X_D$ are also zeros. Proof: Since $X_D=U_D G_{DD}$, the matrix $G_{DD}$ is a K×K lower-triangular matrix which has ones on the diagonal, therefore the theorem is correct.

The method 120 generally converts an (N, K) polar code into an (N-K', K-K') polar code. Initially, the information (user) bits are generally designated as $U_D$ having a length of K-K' bits. A set of K' predetermined bits are initialized by the circuit 100 to all zeros for frozen bits of $U_{\overline{D}}$. In the step 122, the input bits U are generated by concatentating the information bits $U_D$ with the frozen bits $U_{\overline{D}}$ using the circuit 100. The vector U is thus K bits in length.

In the step 124, the input bits U are polar code encoded by the circuit 100 using the matrix G in equation 1 to generate a codeword X. Since the frozen bits $U_{\overline{D}}$ are all zeros and D=E, equation 1 is simplified to equation 2 as follows:

$$X_D=U_D G_{DE}, X_{\overline{D}}=U_D G_{D\overline{E}} \quad (2)$$

Per equation 2, the codeword X has a non-frozen part $X_D=U_D G_{DD}$ and a frozen part $X_{\overline{D}}=U_D G_{D\overline{D}}$. Since the frozen bits $U_{\overline{D}}$ are all zeros, the K' least significant bits of $X_D$ are also all zeros. Thus, the K' all-zero bits in the non-frozen part $X_D$ are discarded in the step 126 leaving a shortened non-frozen part $Y_D$ with a length of K-K' bits. In the step 128, the circuit 100 forms a shortened codeword Y by concatenating the shortened non-frozen part $Y_D$ with the frozen part $X_{\overline{D}}$. The resulting shortened codeword $Y=(Y_D, X_{\overline{D}})$ is written by the circuit 70 into the circuit 80 in the step 130 via the signal I/O. The shortened codeword Y has a length of N-K' bits. Since a value of K' is determined by the user, the codeword Y has a user-controllable length that is not limited to an integer power of 2.

Figure 3:
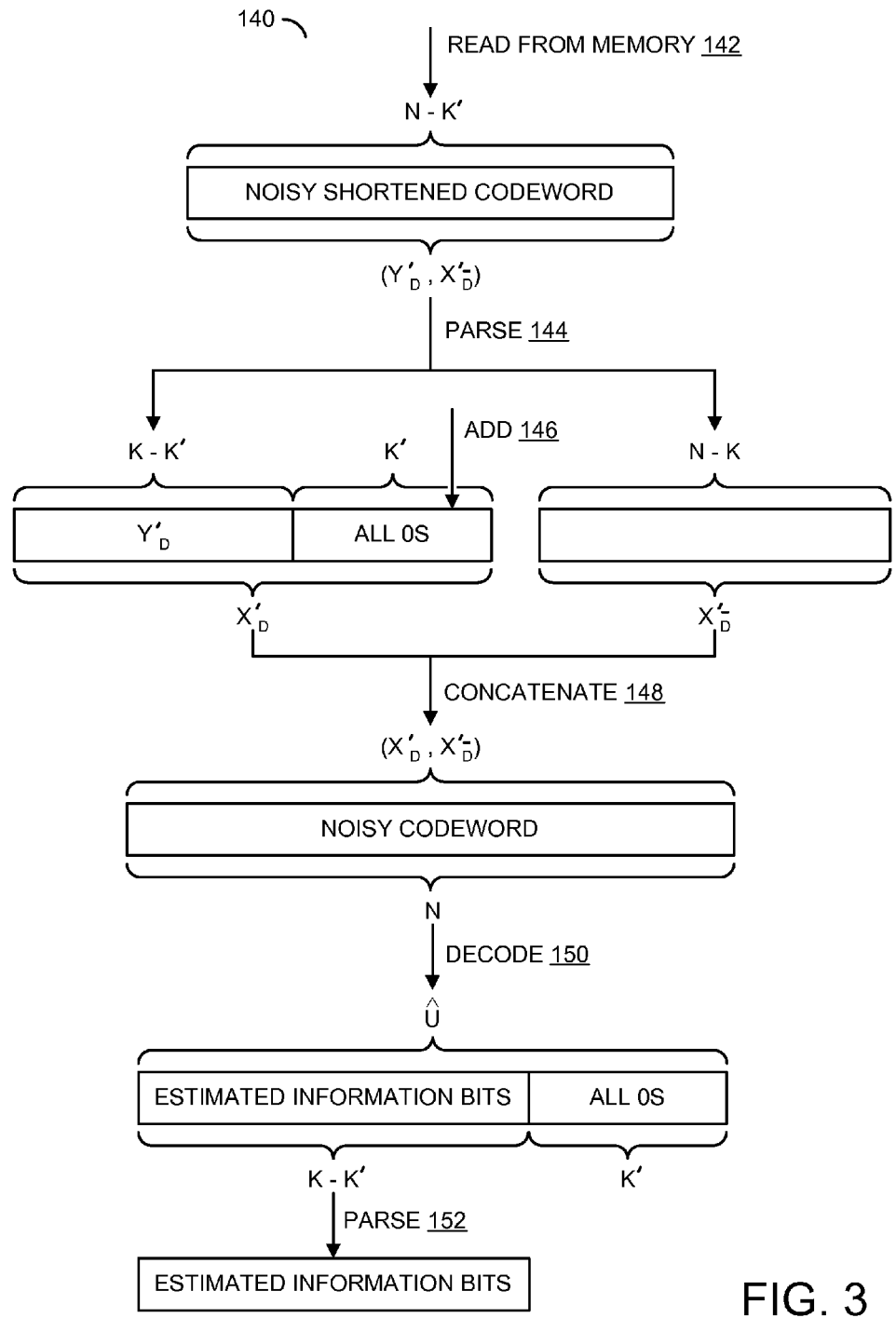
FIG. 3 is a flow diagram of a method for shortened polar code decoding.

Referring to FIG. 3, a flow diagram of an example method 140 for shortened polar code decoding is shown. The method (or process) 140 is implemented by the circuit 90. The method 140 generally comprises a step (or state) 142, a step (or state) 144, a step (or state) 146, a step (or state) 148, a step (or state) 150 and a step (or state) 152. The steps 142 to 152 may represent modules and/or blocks that may be implemented as hardware, software, a combination of hardware and software, or other implementations.

In the step 142, a shortened (and possibly noisy) codeword $Y'=(Y'_n, X'_{\overline{D}})$ is read from the circuit 80 via the signal I/O. The circuit 100 parses the shortened codeword Y' in the step 144 to separate the non-frozen part $Y'_D$ of length K-K' and the frozen part $X'_{\overline{D}}$ of length N-K. In the step 146, K' bits of all zeros are added (concatenated) to a least-significant-bit end the shortened non-frozen part $Y'_D$ by the circuit 100 to generate a non-frozen part $X'_D$ of length K bits. The appended bits are set such that a likelihood of the all zero bits has a probability of unity. The circuit 100 concatenates the shortened non-frozen part $X'_D$ with the frozen part $X'_{\overline{D}}$ in the step 148 to establish a (possibly noisy) codeword X.

In the step 150, the codeword X is polar code decoded to generate the data $\hat{U}$. The data $\hat{U}$ contain both the information bits and the predetermined all zero bits, similar to the input data shown in FIG. 2. The circuit 100 parses the K-K' information bits from the data $\hat{U}$ in the step 152 to recover the estimated information (user) bits.

In some embodiments, the matrix G in a systematic polar code is further permutated by multiplying by a matrix $B_N$, which performs a bit-reversal permutation. As such, the locations of the K' zero bits discarded in the encoding method 120 step 126 and added in the decoding method 140 step 146 are changed accordingly. Therefore, the codeword $X=(X_D, X_{\overline{D}})B_N$ using equation 1 and the discarded K' bits of the codeword X whose indices are the images of the indices of the last K' bits in $X_D$ under bit-reversal, producing the shortened codeword Y. In the decoding, the K' zero bits are added back into the codeword Y' such that the indices of the added bits are the images of the indices of the last K'' bits in $X_D$ under bit-reversal permutations. The result produces the noisy codeword X'. For the bits added, the likelihoods should be set so that the added bits are zeros with a probability of unity.

Figure 4:
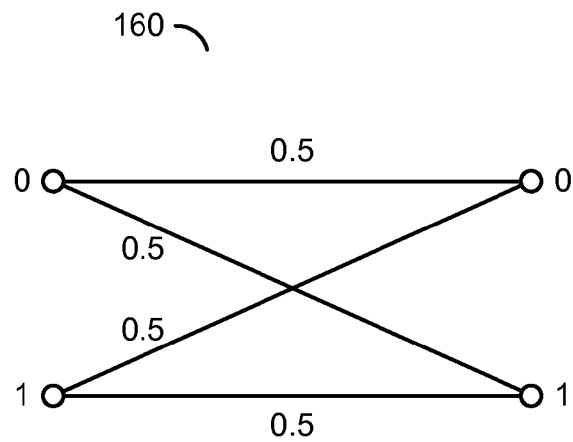
FIG. 4 is a diagram of a noise channel for punctured bits.

Referring to FIG. 4, a diagram of a noise channel 160 for punctured bits is shown. In some embodiments, the K' bits removed can be taken from the frozen part $X_{\overline{D}}$ by puncturing. For decoders, the unpunctured bits and the punctured bits go through two different noise channels. The punctured bits go through an unreliable binary symmetric channel (e.g., BSC) with a transition probability of ½. An effect in the decoder is to declare the inserted punctured bits as erasures.

Figure 5:
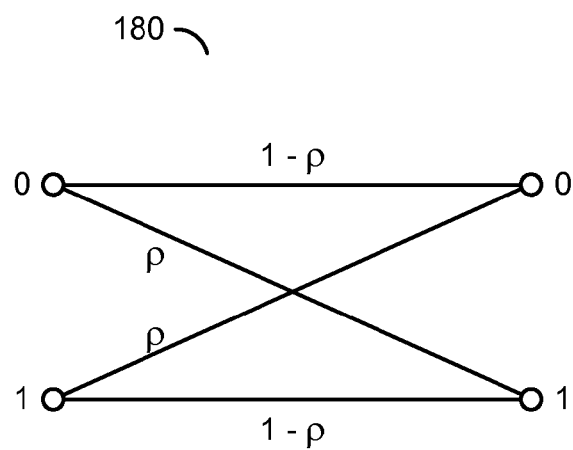
FIG. 5 is a diagram of a noise channel for unpunctured bits.

Referring to FIG. 5, a diagram of a noise channel 180 for unpunctured bits is shown. The unpunctured bits go through the channel of flash memories which can be considered as a reliable binary symmetric channel with transition probability p. The transition probability p is side information obtained about the channel. Note that the transition probability p is overridden with 0:5 only for the punctured bits.

Figure 6:
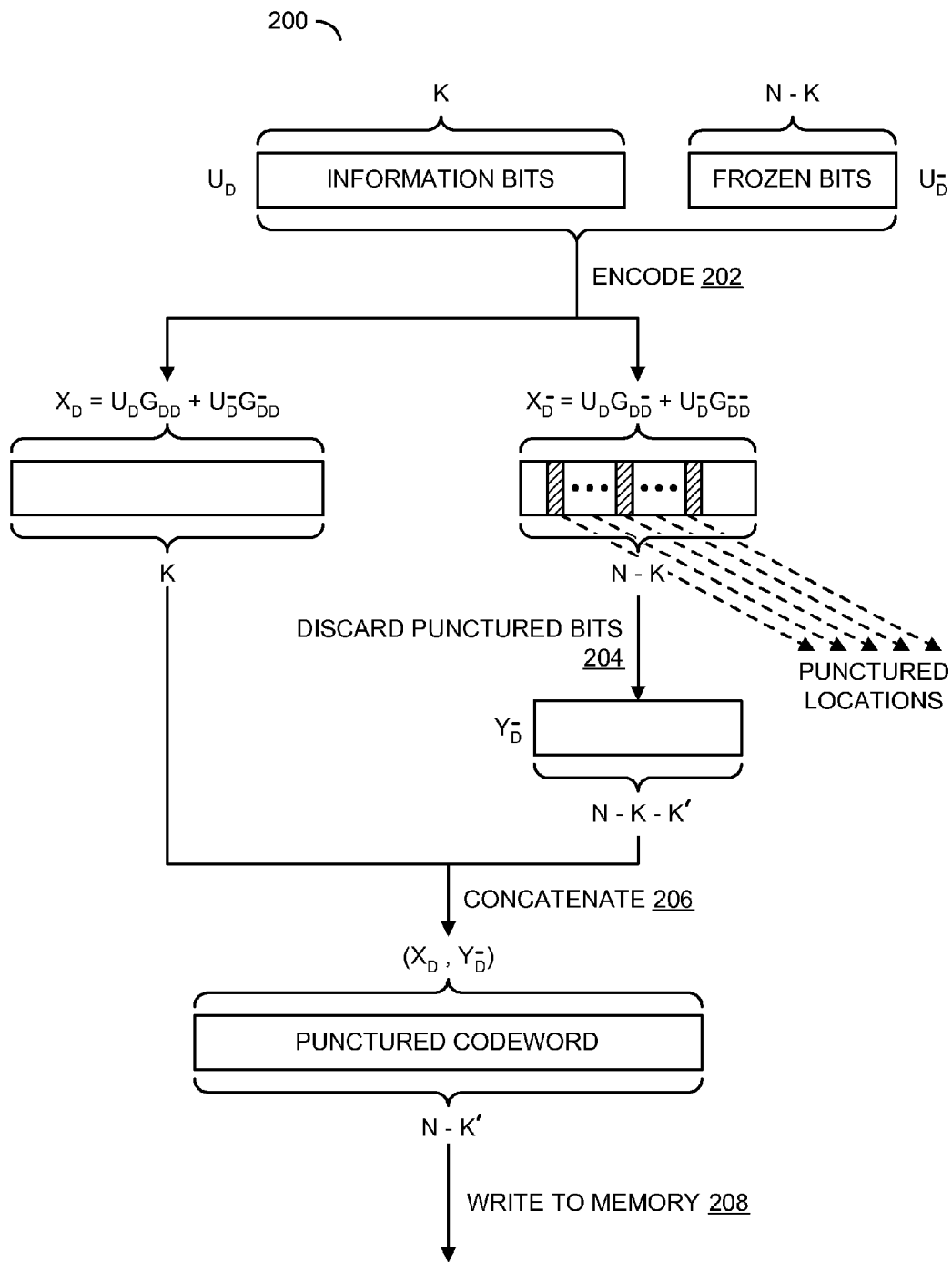
FIG. 6 is a flow diagram of a method for punctured polar code encoding.

Referring to FIG. 6, a flow diagram of an example method 200 for punctured polar code encoding is shown in accordance with an embodiment of the invention. The method (or process) 200 is implemented by the circuit 90. The method 200 generally comprises a step (or state) 202, a step (or state) 204, a step (or state) 206 and a step (or state) 208. The steps 202 to 208 may represent modules and/or blocks that may be implemented as hardware, software, a combination of hardware and software, or other implementations.

The method 200 generally converts an (N, K) polar code into an (N-K', K-K') polar code. Initially, the information (user) bits are generally designated as $U_D$ having a length of K bits. A set of N-K' frozen (or predetermined) bits $U_D$ are initialized by the circuit 100 to predetermined value (e.g., all zeros) made known to both the encoder and the decoder. The input bits U are generated by concatentating the information bits $U_D$ with the frozen bits $U_{\overline{D}}$ using the circuit 100. The vector U is thus N bits in length.

In the step 202, the input bits U are polar code encoded by the circuit 100 using the matrix G in equation 1 to generate a codeword X. The codeword X has a non-frozen part $X_D=U_D G_{DD}+U_{\overline{D}}G_{\overline{D}D}$ and a frozen part $X_{\overline{D}}=U_D G_{D\overline{D}}+U_{\overline{D}}G_{\overline{D}\overline{D}}$. In the step 204, K' bits in punctured locations of the frozen part $X_{\overline{D}}$ are punctured (discarded) leaving a shortened frozen part $Y_{\overline{D}}$ with a length of N-K-K' bits. In the step 206, the circuit 100 forms a reduced codeword Y by concatenating the shortened non-frozen part $X_D$ with the frozen part $Y_{\overline{D}}$. The resulting reduced codeword $Y=(X_D, Y_{\overline{D}})$ is written by the circuit 70 into the circuit 80 in the step 208 via the signal I/O. The reduced codeword Y has a length of N-K' bits. Since a value of K' is determined by the user, the codeword Y has a user-controllable length that is not limited to an integer power of 2.

Figure 7:
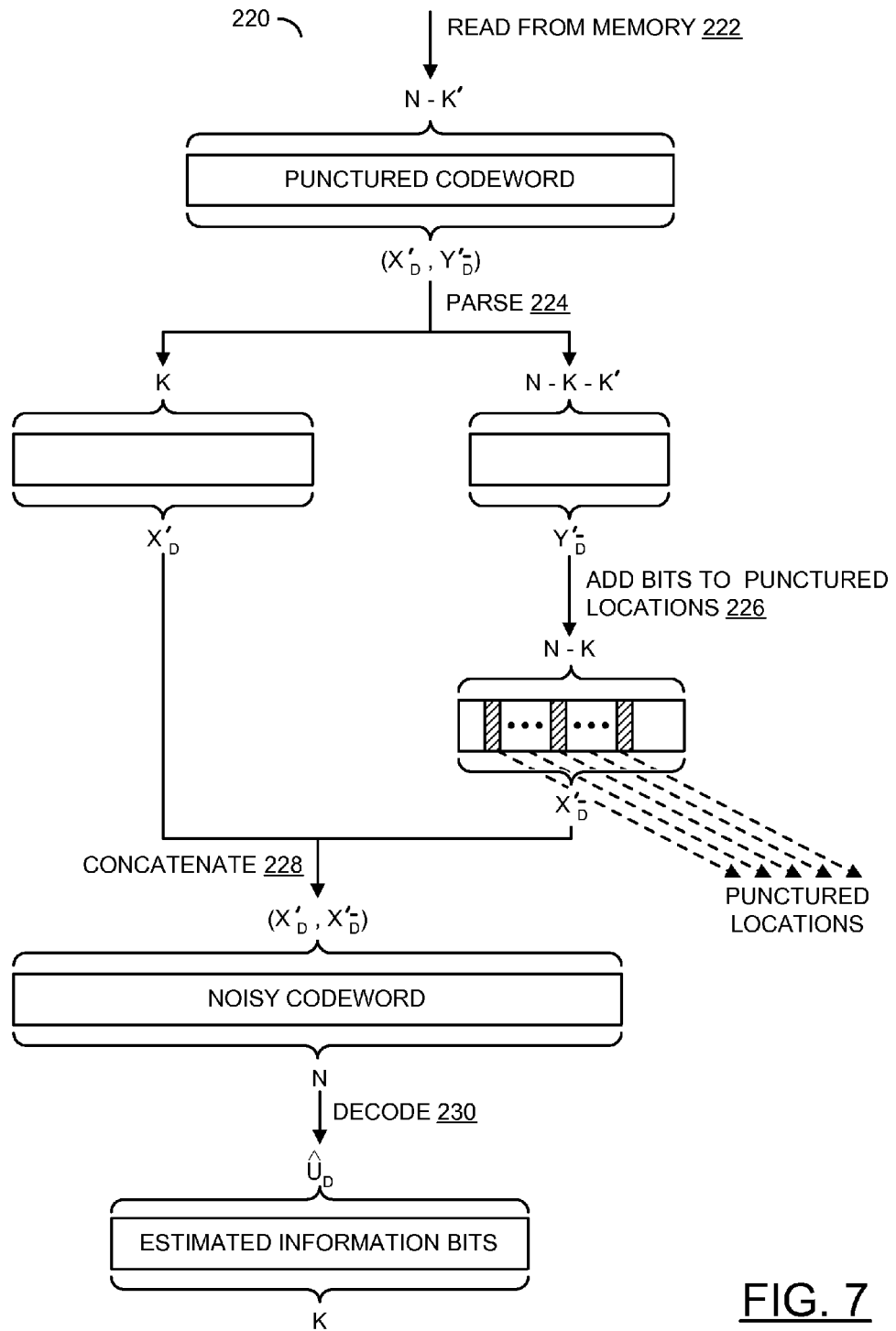
FIG. 7 is a flow diagram of a method for punctured polar code decoding.

Referring to FIG. 7, a flow diagram of an example method 220 for punctured polar code decoding is shown. The method (or process) 220 is implemented by the circuit 90. The method 220 generally comprises a step (or state) 222, a step (or state)

224, a step (or state) 226, a step (or state) 228 and a step (or state) 230. The steps 222 to 230 may represent modules and/or blocks that may be implemented as hardware, software, a combination of hardware and software, or other implementations.

In the step 222, a punctured (and possibly noisy) codeword Y' of length N-K' is read from the circuit 80 via the signal I/O. The circuit 100 parses the codeword Y' in the step 224 to produce a non-frozen part $X'_D$ of length K bits and a punctured frozen part $Y'_{\overline{D}}$ of length N-K-K' bits. Random or predetermined bits are added (or inserted) to the punctured frozen part $Y'_{\overline{D}}$ by the circuit 100 in the step 226 at the punctured locations. The punctured locations are selected by the encoder and made known to the decoder. The decoding treats each added bit as an erasure so that $P(x|0)=P(x|1)=0.5$, where x is the value of a punctured bit that is added. The K' added bits create another frozen part $X'_{\overline{D}}$ which has a length of N-K bits.

In the step 228, the circuit 100 generates a codeword X by concatenating the non-frozen part $X'_D$ with the non-frozen part $X'_{\overline{D}}$. The codeword X has a length of N bits. The circuit 100 polar code decodes the codeword X in the step 230. The polar code decoding creates the data $\hat{U}$ with a length of K bits.

In some embodiments, the matrix G in a systematic polar code is further permuted by multiplying by a matrix $B_N$ which performs a bit-reversal permutation. As such, the locations of the K' zero bits punctured in the encoding method 200 step 204 and added in the decoding method 220 step 226 are changed accordingly. While encoding, the K' bits of the codeword X having indices that are the images of the indices of K' preselected bits in the non-frozen part X are punctured under bit-reversal permutations, producing a codeword Y. While decoding, the K' random bits are added back to the frozen part $Y_D$ such that the indices of the added bits are the images of the indices of the K' bits in the non-frozen part $X_D$ under bit-reversal permutations to produce the noisy codeword X'. The image indices are selected by the encoder and made known to the decoder. The decoding treats each added bit as an erasure so that $P(x|0)=P(x|1)=0.5$, where x is the value of a punctured bit that is added.

Figure 8:
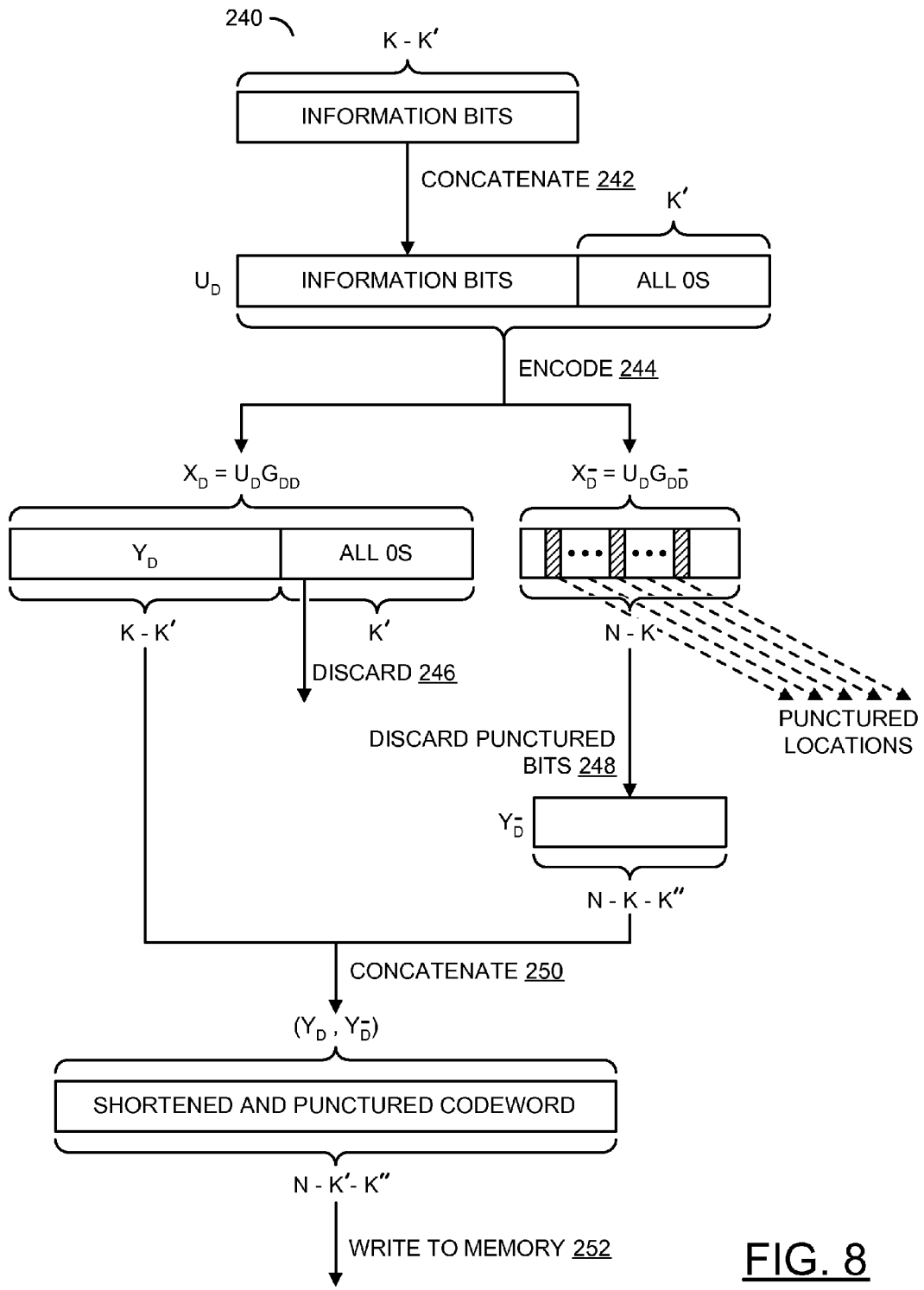
FIG. 8 is a flow diagram of a method for polar code encoding with shortening and puncturing.

Referring to FIG. 8, a flow diagram of an example method 240 for polar code encoding with shortening and puncturing is shown. The method (or process) 240 is implemented by the circuit 90. The method 240 generally comprises a step (or state) 242, a step (or state) 244, a step (or state) 246, a step (or state) 248, a step (or state) 250 and a step (or state) 252. The steps 242 to 252 may represent modules and/or blocks that may be implemented as hardware, software, a combination of hardware and software, or other implementations.

The method 240 generally converts an (N, K) polar code into an (N-K'-K", K-K'-K") polar code, where K' bits are shortened and K" bits are punctured. Initially, the information (user) bits are generally designated as $U_D$ having a length of K-K' bits. A set of K' predetermined bits are initialized by the circuit 100 to all zeros for frozen bits of $U_{\overline{D}}$. The input bits U are generated by concatentating the information bits $U_D$ with the frozen bits $U_{\overline{D}}$ using the circuit 100 in the step 242. The vector U is thus K bits in length.

In the step 244, the input bits U are polar code encoded by the circuit 100 using the matrix G in equation 1 to generate a codeword X. The codeword X has a non-frozen part $X_D=U_D G_{DD}$ and a frozen part $X_{\overline{D}}=U_D G_{D\overline{D}}$. In the step 246, the K' all zero bits are removed from the non-frozen part $X_D$. In the step 248, K" bits in the punctured locations of the frozen part $X_{\overline{D}}$ are punctured (discarded) leaving a punctured frozen part $Y_{\overline{D}}$ with a length of N-K-K" bits. In the step 250, the circuit 100 forms a reduced codeword Y by concatenating the shortened non-frozen part $X_D$ with the punctured frozen part $Y_{\overline{D}}$. The resulting reduced codeword $Y=(Y_D, Y_{\overline{D}})$ is written by the circuit 70 into the circuit 80 in the step 252 via the signal I/O. The reduced codeword Y has a length of N-K'-K" bits. Since a values of K' and K" are determined by the user, the codeword Y has a user-controllable length that is not limited to an integer power of 2.

Figure 9:
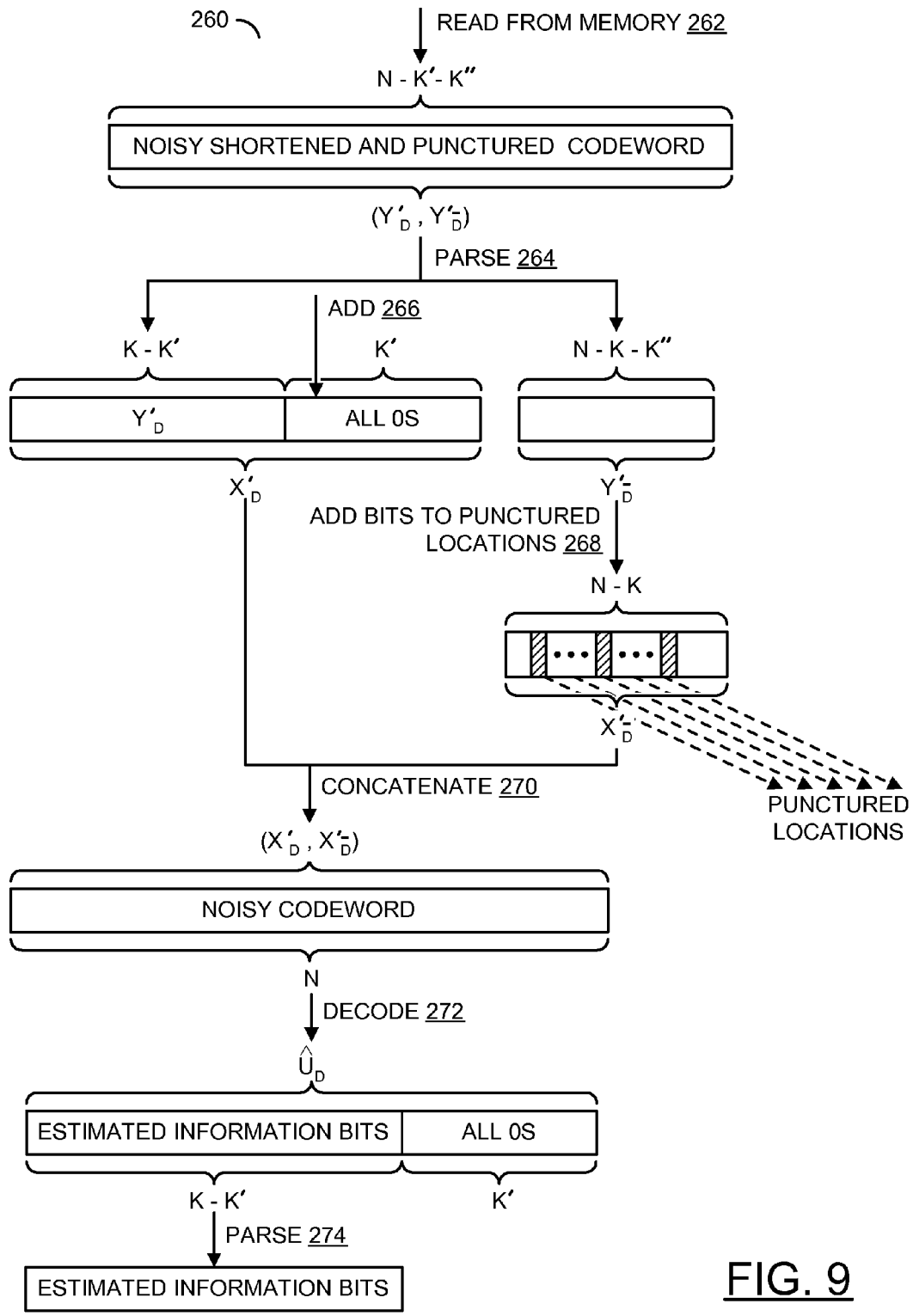
FIG. 9 is a flow diagram of a method for polar code decoding with shortening and puncturing.

Referring to FIG. 9, a flow diagram of an example method 260 for polar code decoding with shortening and puncturing is shown. The method (or process) 260 is implemented by the circuit 90. The method 260 generally comprises a step (or state) 262, a step (or state) 264, a step (or state) 266, a step (or state) 268, a step (or state) 270, a step (or state) 272 and a step (or state) 274. The steps 262 to 274 may represent modules and/or blocks that may be implemented as hardware, software, a combination of hardware and software, or other implementations.

In the step 262, a shortened and punctured (and possibly noisy) codeword Y' of length N-K'-K" is read from the circuit 80 via the signal I/O. The circuit 100 parses the codeword Y in the step 264 to produce a shortened non-frozen part $Y'_D$ of length K-K' bits and a punctured frozen part $Y'_D$ of length N-K-K" bits. In the step 266, K' bits of all zeros are added (concatenated) to a least-significant-bit end the shortened non-frozen part $Y'_D$ by the circuit 100 to generate a non-frozen part $X'_D$ of length K bits. Random or predetermined bits are added to the punctured frozen part $Y'_{\overline{D}}$ by the circuit 100 in the step 268 at the K" punctured locations. The punctured locations are selected by the encoder and made known to the decoder. The decoding treats each added bit as an erasure so that $P(x|0)=P(x|1)=0.5$, where x is the value of the punctured bit added. The K" added bits create another frozen part $X'_{\overline{D}}$ which has a length of N-K bits.

In the step 270, the circuit 100 generates a codeword X' by concatenating the non-frozen part $X'_D$ with the frozen part $X'_{\overline{D}}$. The codeword X' has a length of N bits. The circuit 100 polar code decodes the codeword X in the step 272. The polar code decoding create the data $\hat{U}_D$ with a length of K bits. In the step 274, the estimated information bits are parsed from the data $\hat{U}_D$. The estimated information bits generally have a length of K-K' bits.

Figure 10:
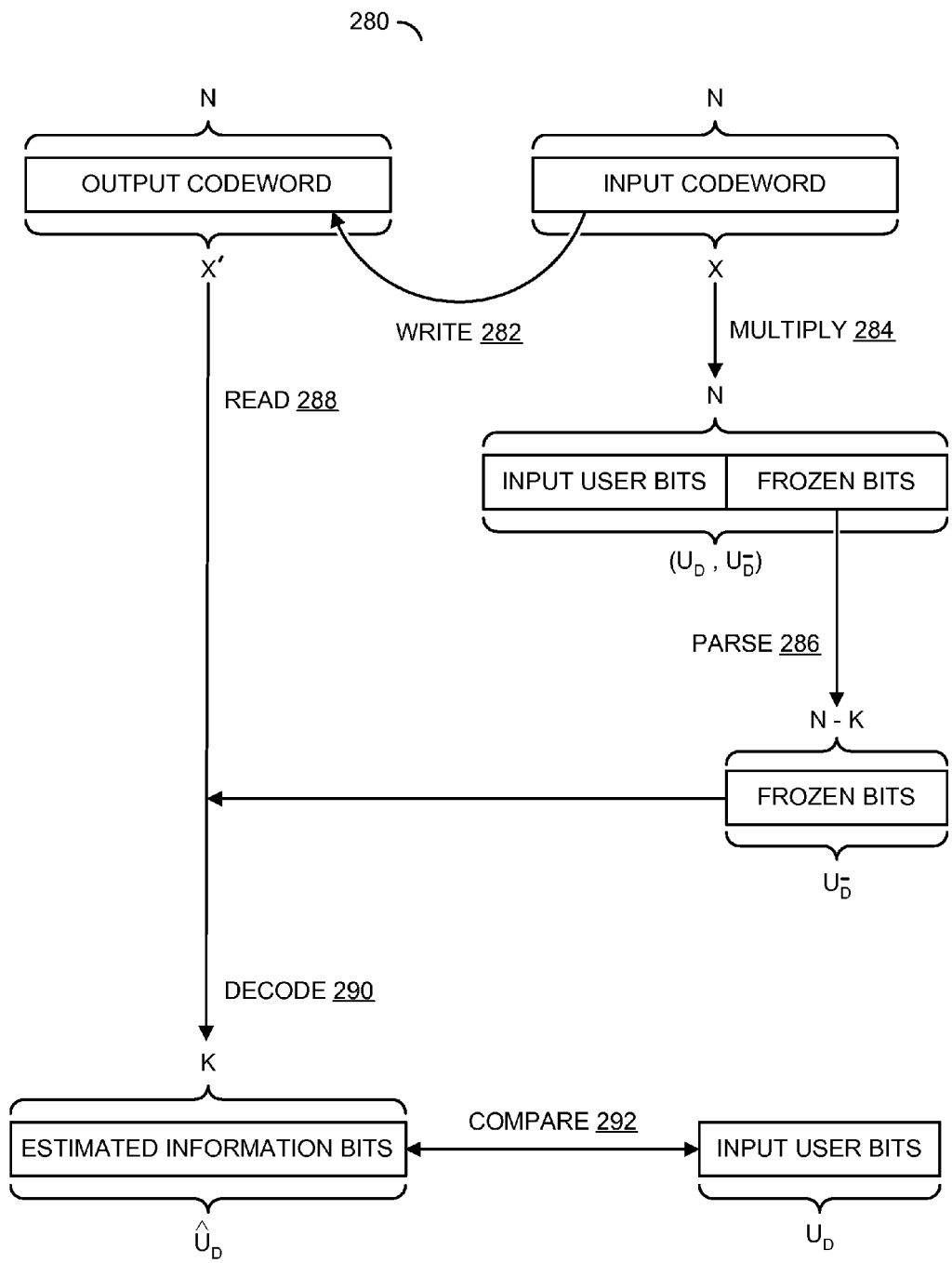
FIG. 10 is a flow diagram of a method for coset coding for non-systematic polar codes.

Referring to FIG. 10, a flow diagram of an example method 280 for coset coding for non-systematic polar codes is shown. The method 280 is used for testing a performance of polar codes using random input/output data collected from storage test/characterization platforms. The method (or process) 280 is implemented by the circuit 90. The method 280 generally comprises a step (or state) 282, a step (or state) 284, a step (or state) 286, a step (or state) 288, a step (or state) 290, and a step (or state) 292. The steps 282 to 292 may represent modules and/or blocks that may be implemented as hardware, software, a combination of hardware and software, or other implementations.

To test and compare the performance of different error correcting codes, input and output data traces are collected from the circuits 82a-82n. The data traces form sequences of random bits. To test the performance of polar codes using the random data involves taking a sequence of N random bits as a polar code codeword.

Consider a trace collected from flash memory (e.g., the circuit 80) that has N input (write) noise-free bits $X \triangleq (X_1, X_2, X_N)$ and N output (read) noisy raw bits $X' \triangleq (X'_1, X'_2, \ldots, X'_N)$. Let the polar code under test using the flash data have a set of frozen channel indices $\overline{D}$ and the set of non-frozen channel indices D. Let G be the N×N generator matrix of the polar codes. Note that the generator matrix G of the polar codes is invertible.

The N input noise-free bits X are referred to as an input codeword. In the step 282, the input codeword X is written into the circuit 80. The circuit 100 multiplies the input codeword X by an inverted matrix (e.g., $G^{-1}$) in the step 284 to generate data $U \triangleq (U_1, U_2, \ldots, U_N) = XG^{-1}$. The data U includes a user input bits portion $U_D$ of K bits and a frozen bits portion $U_{\overline{D}}$ of N-K bits. The frozen bits part $U_{\overline{D}}$ is parsed from the data U in the step 286.

In the step 288, the output codeword X' is read from the memory 80 by the circuit 70. The circuit 100 takes the output codeword X', computes values of the frozen bits $U_{\overline{D}}$ and performs polar code decoding. The polar code decoding is based on multiple (e.g., three) pieces of information: a noisy version of the codeword to be corrected during the decode, the frozen indices $\overline{D}$, and the values of the frozen bits. The three pieces of information are used separately in the decode to correct the noisy codeword. The result of the decoding is the estimated data $\hat{U}$ in the step 290. The estimated information bits are compared to the input user bits in step 292 by the circuit 100 to determine a performance of the matrix G is correcting noise (or errors) in the output codeword X'.

Figure 11:
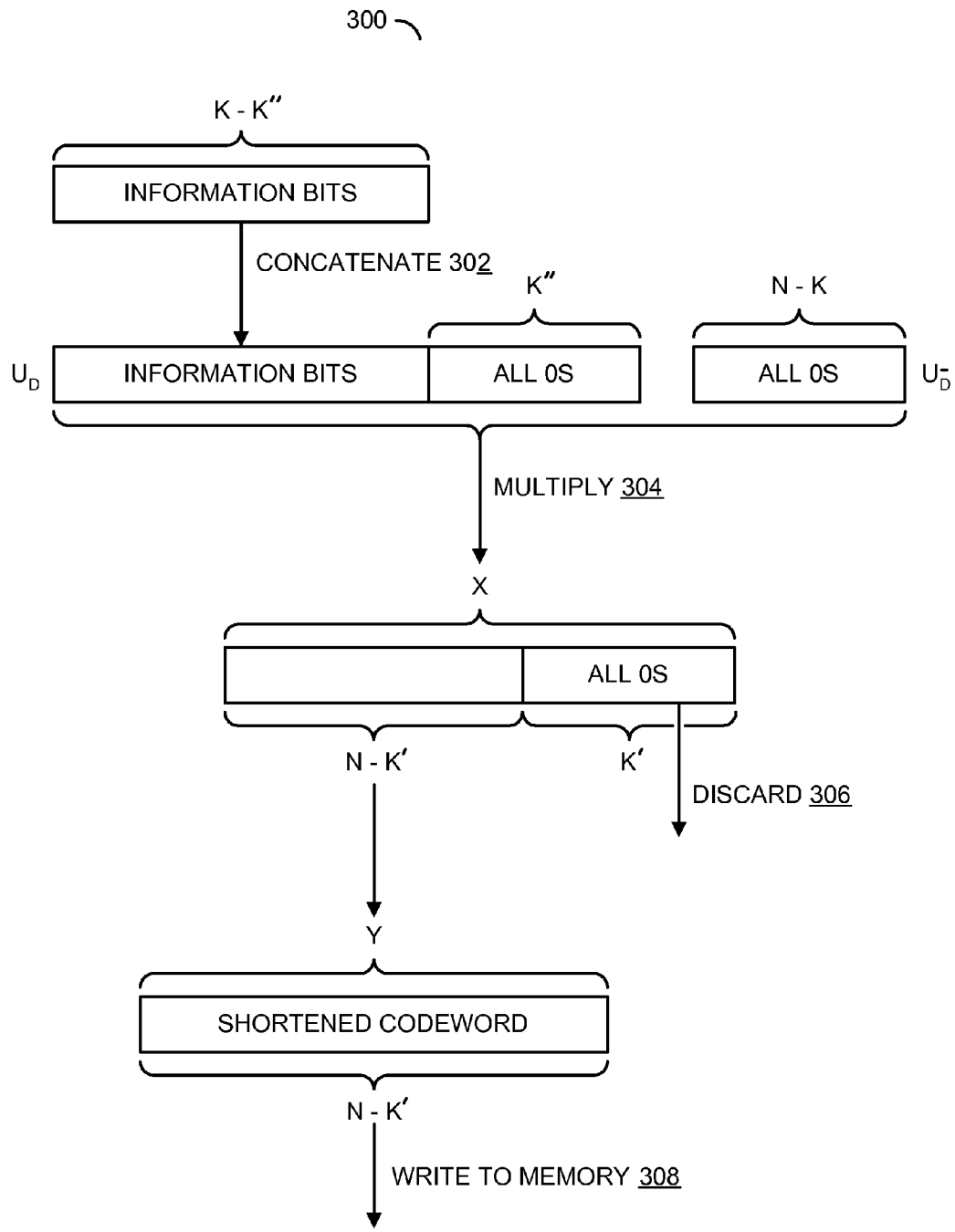
FIG. 11 is a flow diagram of a method for shortened non-systematic polar code encoding.

Referring to FIG. 11, a flow diagram of an example method 300 for shortened non-systematic polar code encoding is shown. The method (or process) 300 is implemented by the circuit 90. The method 300 generally comprises a step (or state) 302, a step (or state) 304, a step (or state) 306 and a step (or state) 308. The steps 302 to 308 may represent modules and/or blocks that may be implemented as hardware, software, a combination of hardware and software, or other implementations.

Theorem: If the last K' bits of U are all zeros, the last K' bits of X are also zeros. Proof: The matrix G is a lower-triangular matrix which has ones on the diagonal, therefore the theorem is correct.

Consider an (N, K)-binary polar code. An (N-K', K-K") code may be created by the method 300 where K"=|{i|i∈D and N-K'+1≤i≤N}|. Initially, the information (user) bits have a length of K-K" bits. A set of K" predetermined bits and a set of N-K predetermined bits (e.g., $U_{\overline{D}}$) are initialized by the circuit 100 to all zeros. In the step 302, the information bits are concatenated with the K" predetermined bits and are generally designated as $U_D$ having K bits in length. A combination of the K bit $U_D$ and the N-K frozen bit $U_{\overline{D}}$ (e.g., together forming the vector U) are multiplied by the matrix G in the step 304 to compute the codeword X (e.g., X=UG). Since the last K' bits (e.g., K'=K"+N-K) of the vector U are all zeros, the K' least significant bits of the codeword X are also all zeros. Thus, the K' all-zero bits in the codeword X are discarded in the step 306 leaving a codeword Y with a length of N-K' bits. The codeword Y is written by the circuit 70 into the circuit 80 in the step 308 via the signal I/O. The rate of the non-systematic polar codes shortened from an (N,K) polar code is $$\frac{N-K''}{N-K'} \in \left[\frac{K-K'}{N-K'}, \frac{K}{N}\right].$$

Figure 12:
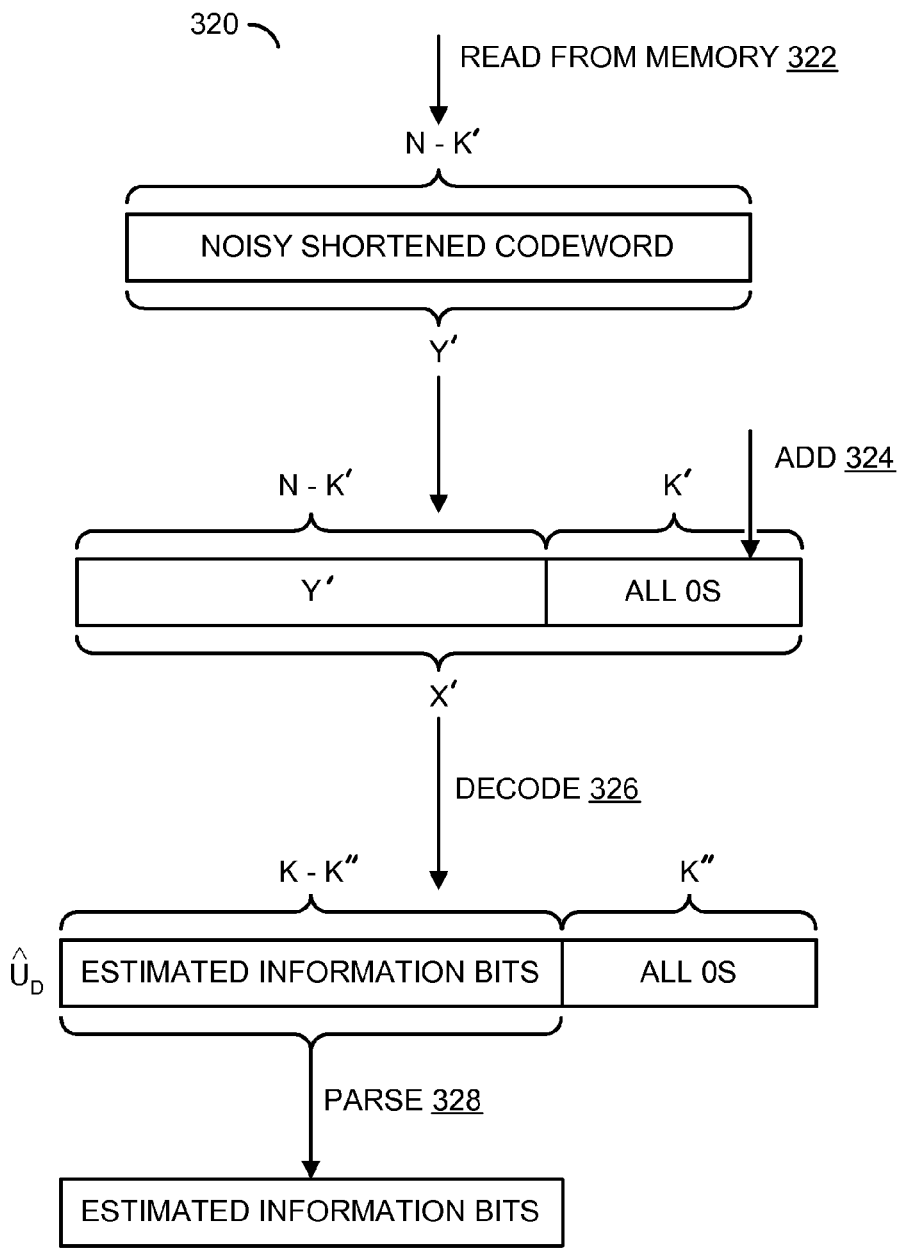
FIG. 12 is a flow diagram of a method for shortened non-systematic polar code decoding.

Referring to FIG. 12, a flow diagram of an example method 320 for shortened non-systematic polar code decoding is shown. The method (or process) 320 is implemented by the circuit 90. The method 320 generally comprises a step (or state) 322, a step (or state) 324, a step (or state) 326 and a step (or state) 328. The steps 322 to 328 may represent modules and/or blocks that may be implemented as hardware, software, a combination of hardware and software, or other implementations.

In the step 322, a shortened (and possibly noisy) codeword Y' is read from the circuit 80 via the signal I/O. In the step 324, K' bits of all zeros are added (concatenated) to a least-significant-bit end the codeword Y' by the circuit 100 to generate the codeword X' of length N bits. In the step 326, the codeword X' is polar code decoded to generate the non-frozen bits $\hat{U}_D$. The non-frozen bits $\hat{U}_D$ contain both the information bits and the predetermined all zero bits. When decoding, the likelihoods of the K' appended bits should be set so that each appended bit is zero with a probability of one. The values of the last K" bits of $\hat{U}_D$ are also set to zeros during the decoding. The circuit 100 parses the K-K" information bits from the data $\hat{U}_D$ in the step 328 to recover the estimated information (user) bits.

In some embodiments, the matrix G is further permutated by multiplying by the matrix $B_N$, which performs the bit-reversal permutation. As such, the locations of the K' zero bits discarded in the encoding method 300 step 306 and added in the decoding method 320 step 324 are changed accordingly. Therefore, the codeword $X = UGB_N$ and the discarded K' bits of the codeword X whose indices are the images of the indices of the last K" bits in $U_D$ and the last K'-K" bits in $U_{\overline{D}}$ under bit-reversal, producing the shortened codeword Y. In the decoding, the K' zero bits are added back into the codeword Y' such that the indices of the added bits are the images of the indices of the last K" bits in $U_D$ and the last K'-K" bits in $U_{\overline{D}}$ under bit-reversal permutations. The result produces the noisy codeword X'. For the bits added, the likelihoods should be set so that the added bits are zeros with a probability of unity. The values of the last K" bits of $\hat{U}_D$ are also set to zero during the decoding.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for encoding a reduced polar code, comprising the steps of:
   (A) generating an intermediate codeword by polar code encoding input data;
   (B) removing one or more bits from one of (i) a first part of said intermediate codeword and (ii) a second part of said intermediate codeword; and
   (C) generating an output codeword by concatenating said first part of said intermediate codeword with said second part of said intermediate codeword after said bits are removed.

2. The method according to claim 1, further comprising the step of:
   concatenating predetermined data to said input data prior to said polar code encoding.

3. The method according to claim 1, wherein said removing discards said bits from said first part of said intermediate codeword.

4. The method according to claim 1, wherein said removing punctures said bits from said second part of said intermediate codeword at one or more punctured locations.

5. The method according to claim 1, wherein said removing comprises:
   discards a first portion of said bits from said first part of said intermediate codeword; and
   puncturing a second portion of said bits from said second part of said intermediate codeword.

6. The method according to claim 1, further comprising the steps of:
   adding one or more bits to one of (i) a first part of an output codeword and (ii) said second part of said output codeword;
   generating an internal codeword by concatenating said first part of said output codeword and said second part of said output codeword after said adding of said bits; and
   generating output data by polar code decoding said internal codeword.

7. The method according to claim 1, further comprising the step of:
   writing said output codeword into a nonvolatile memory.

8. The method according to claim 1, wherein said method is implemented in one or more integrated circuits.

9. A method for decoding a reduced polar code, comprising the steps of:
   (A) adding one or more bits to one of (i) a first part of an input codeword and (ii) a second part of said input codeword;
   (B) generating an internal codeword by concatenating said first part of said input codeword and said second part of said input codeword after said adding of said bits; and
   (C) generating output data by polar code decoding said internal codeword.

10. The method according to claim 9, further comprising the step of:
    removing predetermined data from said output data.

11. The method according to claim 9, wherein said adding concatenates said bits to said first part of said input codeword prior to said polar code decoding.

12. The method according to claim 9, wherein said adding inserts said bits into said second part of said input codeword in one or more punctured locations.

13. The method according to claim 9, wherein said adding (i) concatenates a first portion of said bits to said first part of said input codeword prior to said polar code decoding and (ii) inserts a second portion of said bits into said second portion of said input codeword in one or more punctured locations.

14. The method according to claim 9, further comprising the step of:
    reading said input codeword from a nonvolatile memory.

15. The method according to claim 9, wherein said method is implemented in one or more integrated circuits.

16. A method for decoding a polar code, comprising the steps of:
    (A) generating an output codeword by reading an input codeword stored in a memory, wherein said input codeword has a random value;
    (B) generating a first part of input data and a second part of said input data by multiplying said input codeword by a matrix;
    (C) generating output data by polar code decoding said output codeword based on said second part of said input data; and (D) determining a performance of said matrix to correct errors by comparing said output data to said input data.

17. The method according to claim 16, wherein said output codeword is a noisy version of said input codeword.

18. The method according to claim 16, wherein said method is implemented as one or more integrated circuits.

* * * * *